United States Patent [19]

Schorr

[11] Patent Number: 4,587,437
[45] Date of Patent: May 6, 1986

[54] COUPLING/DECOUPLING CAPACITOR MULTIPLIER

[75] Inventor: Ian A. Schorr, Chicago, Ill.

[73] Assignee: Rockwell International Corporation, El Segundo, Calif.

[21] Appl. No.: 590,400

[22] Filed: Mar. 19, 1984

[51] Int. Cl.⁴ .............................................. H03H 7/10
[52] U.S. Cl. .................................................. 307/109
[58] Field of Search ........................... 361/433; 330/7;
323/370; 328/128; 307/109

[56] References Cited

U.S. PATENT DOCUMENTS

| | | | |
|---|---|---|---|
| 2,956,234 | 10/1960 | Olsen | 330/7 X |
| 3,302,121 | 1/1967 | Schmid | 330/7 |
| 3,702,405 | 11/1972 | Zwirn et al. | 307/109 |
| 3,939,468 | 2/1976 | Mastin | 330/7 X |
| 4,025,867 | 5/1977 | Seidel | 328/128 X |

Primary Examiner—Donald A. Griffin
Attorney, Agent, or Firm—Carmen B. Patti; V. Lawrence Sewell; H. Fredrick Hamann

[57] ABSTRACT

The invention discloses an improved capacitor multiplier which can be applied in both floating coupling and in grounded decoupling applications.

1 Claim, 4 Drawing Figures

COUPLING/DECOUPLING CAPACITOR MULTIPLIER

BACKGROUND OF THE INVENTION

This invention relates to coupling/decoupling capacitor multipliers and, in particular, to a capacitor multiplier employing op-amp technology.

Every real capacitor can be represented by an equivalent circuit, in which:
- C = equivalent capacitance;
- ESR = equivalent series resistance;
- RL = leakage resistance; and
- LS = series inductance.
- RL is in parallel with series connected ESR and C which circuit is in series with LS In all low and medium frequency applications, the series inductance can be ignored and the capacitor's properties can be sufficiently described by RL, ESR, and C. Commonly, instead of leakage resistance RL, a leakage current IL is used to describe leakage of the capacitor. An ideal capacitor should have both IL and ESR equal to zero.

In many applications there is a need for large capacitors with low ESR, low leakage, and high operating voltage. The prior art has addressed the need for large capacitors in the following way.

To achieve a large capacitor, large electrolytic or tantalum capacitors are employed. Such a capacitor suffers from leakage current and usually substantial AC losses. In addition, the size of such capacitors are proportional to the product of capacitance and square of operating voltage, leading to unusually large sizes for high operating voltage.

Another approach to achieve a large capacitor is found in the use of a capacitor multiplier which employs operational amplifier technology. An example of such a solution is shown in FIGS. 1, 2 and 3. The capacitor multiplier of FIG. 1 creates an equivalent capacitor with the following parameters $$Ceq = C1 \cdot \frac{R1}{R3}$$

$$IL = \frac{Vos + Ios \cdot R1}{R3}$$

$$ESR = R3$$

in which:
- R1, R2, R3, and C1 are components used with the op-amp multiplier in the circuit;
- IL represents leakage current;
- Ceq represents equivalent capacitance;
- ESR represents the equivalent series resistance; and
- Ios and Vos represent offset current and offset voltage, respectively.

The shortcomings of the capacitor multiplier in FIG. 1 are summarized as follows:
1. Substantial losses due to relatively large value of R3 occur. Consequently, high Q capacitance cannot be realized.
2. Leakage current can be very substantial for op-amp with large offset voltage or current. Also, it will change with temperature as offset current and voltage does.
3. Maximum DC operating voltage is limited to the maximum operating voltage of an op-amp.
4. Only a grounded capacitor can be implemented. Consequently, the configuration described above cannot be used as a floating capacitor, ruling out a coupling capacitor application.

The capacitor multiplier of FIG. 2 creates a negative capacitor not used in coupling or decoupling applications. Furthermore, the shortcomings described in Paragraphs 2, 3, and 4, above for the capacitor multiplier of FIG. 1 also apply to the multiplier shown in FIG. 2.

The capacitor multiplier configuration shown in FIG. 3 creates an equivalent capacitor as described by the following equation:

$$Ceq = C1 \cdot (R2/R1 + 1)$$

While the capacitor multiplier shown in FIG. 3 solves the leakage problem of the circuits shown in FIGS. 1 and 2 it, however, experiences the shortcomings of paragraphs 3 and 4 listed above for the multiplier of FIG. 1.

SUMMARY OF THE INVENTION

The invention discloses an improved capacitor multiplier which can be applied in both floating coupling and grounded decoupling application. The multiplier includes an amplifier means operatively connected to a resistor and a pair of capacitors. The load output voltage of the multiplier is independent of the operating voltage characteristics of the amplifier means.

OBJECTS OF THE INVENTION

It is a general object of the present invention to provide an improved coupling/decoupling capacitor multiplier.

It is a more specific object of the present invention to provide an improved coupling/decoupling capacitor multiplier which can be applied in a grounded and floating application.

BRIEF DESCRIPTION OF THE DRAWINGS

The features of the present invention, which are believed to be novel, are set forth with particularly in the appended claims. The invention, together with further objects and advantages, may best be understood by reference to the following description taken in conjunction with the accompanying drawings, in which:

DESCRIPTION OF THE PREFERRED EMBODIMENT

This invention pertains to a solid-state capacitor multiplier which could be used in any application where a large coupling or decoupling capacitor is required. Some of the most common applications could include power supplies, low frequency signal amplifiers, audio amplifiers, power amplifiers, telephone voice frequency repeaters.

Figure 1:
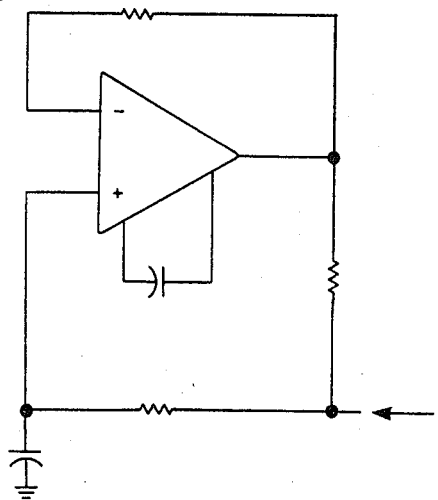
FIGS. 1, 2 and 3, are representative of the prior art.
Figure 2:
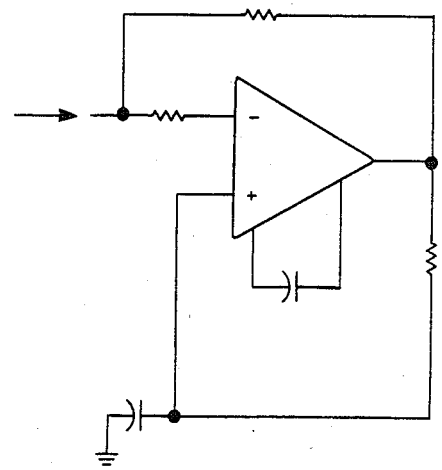
Figure 3:
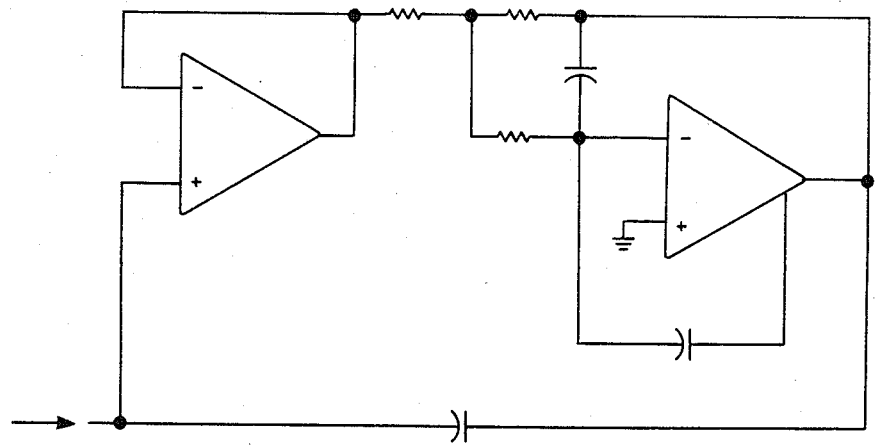
Figure 4:
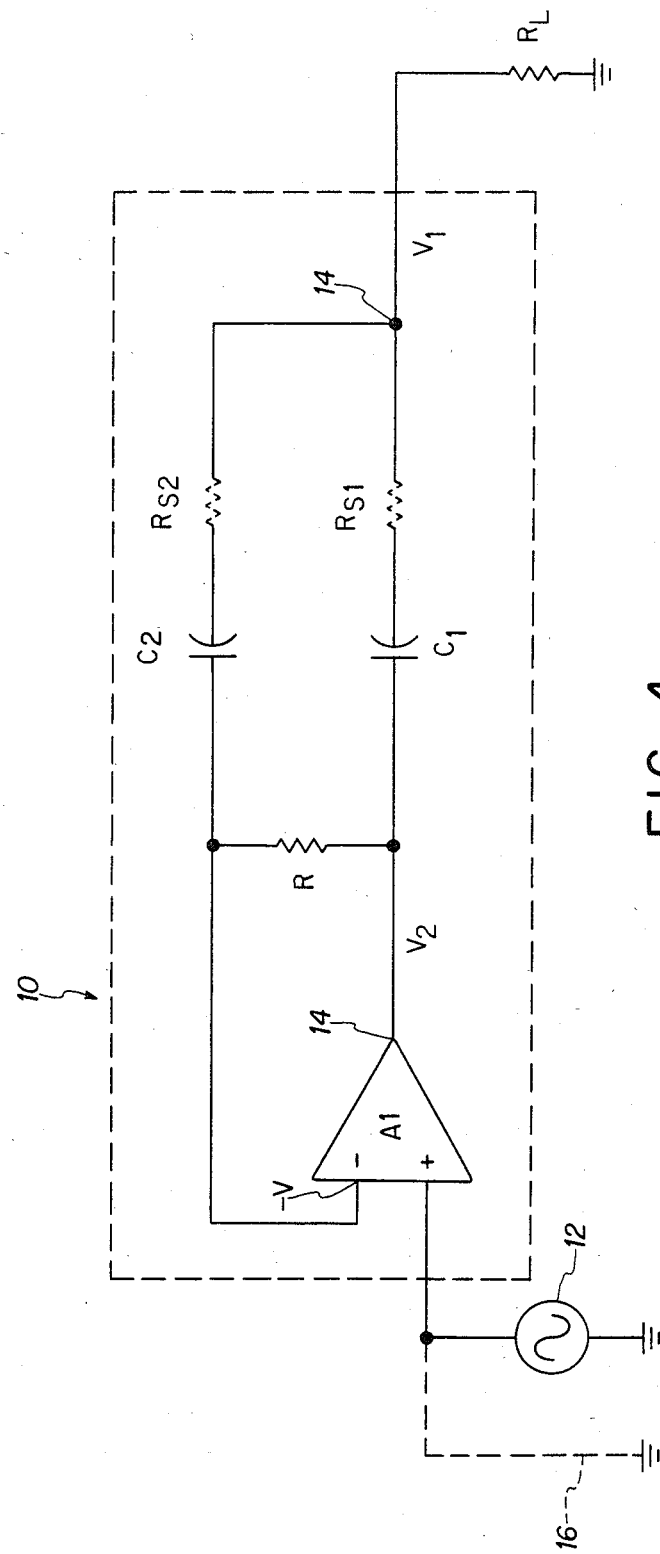
FIG. 4 is a circuit representation of the novel coupling/decoupling capacitor multiplier of the invention.

The invention as depicted in FIG. 4, shows a coupling/decoupling capacitor multiplier 10 of the invention which is connected to an AC voltage source 12 and a load RL.

The multiplier 10 includes an amplifier means such as op-amp A1 having a non-inverting input connected to the AC voltage source 12. A capacitor C1 is connected to the output of op-amp A1 and to a load output 14 of the capacitor multiplier 10. A capacitor C2 is connected to inverting input of the op-amp A1 and to the load output 14 of the capacitor multiplier 10.

A resistor R is connected between the inverting input of op-amp A1 and the output of op-amp A1. R is in series with C1 and C2. The C2 and R junction is connected to the inverting input of the op-amp A1, and the C1 and R junction is connected to the output of op-amp A1.

Resistor RS1 in series with C1, and resistor RS2 in series with C2, are equivalent series resistance for the respective capacitors.

C1 and C2 are connected at the load output 14 of the multiplier 10. The DC voltage at the load output 14 is independent of the operating voltage characteristics of the op-amp 14 as the op-amp does not see the DC voltage at load output 14.

The multiplier 10 is shown in a floating embodiment and to achieve grounded decoupling, the non-inverting input of op-amp A1 is connected to ground at 16 as shown in FIG. 4. To understand the invention, equations pertaining to the operation of the circuit will be developed for Ceq (equivalent capacitance of the multiplier 10) and Req (equivalent series resistance of the multiplier 10). While the equations are derived for the grounded application, the ultimate result will be the same for the floating capacitor application.

The equations for Ceq and Req will now be developed for the following three sets of conditions where:
1. C1 and C2 are lossless;
2. C1 is lossles and C2 is lossy; and
3. C1 is lossy and C2 is lossless.

In the first set of conditions, where capacitor C1 and C2 are lossless, that is, RS1 and RS2 equal zero, assume further that V2 is much greater than Vc2, V1, and V—, and further assume that input impedance of an op-amp equals infinity, we may then state the following equation, $$V_- = \frac{V2}{K(s)}$$

where $K(s)$ is the open loop gain of the op-amp A1. Then the following equations express the value of Ceq and Req:

$$Vc2 = Ic2 \cdot \frac{1}{Sc2} = V2 \cdot \frac{1}{R + \frac{1}{Sc2}} \cdot \frac{1}{Sc2}$$

For $1/SC2 << R$ $$VC2 \approx \frac{V2}{RSC2}$$

$$V1 = V_- + VC2 = V2\left[\frac{1}{RSC2} + \frac{1}{K(s)}\right]$$

$$V2 \approx IC1 \cdot \frac{1}{SC1}, \text{ FOR } IC1 >> IC2$$

Consequently, $$V1 = IC1 \cdot \frac{1}{SC1} \cdot \left[\frac{1}{RSC2} + \frac{1}{K(s)}\right]$$

-continued $$\text{BUT } V1 = IC1 \cdot \left[\frac{1}{SCeq} + Req\right]$$

$Ceq$ = EQUIVALENT CAPACITANCE AT $V1$ INPUT WITH EQUIVALENT SERIES RESISTANCE $Req$ $$IC1 \cdot \left[\frac{1}{SCeq} + Req\right] = IC1 \cdot \frac{1}{SC1} \cdot \left[\frac{1}{RSC2} + \frac{1}{K(s)}\right]$$

$$Ceq = \frac{C1}{\frac{1}{K(s)}} = C1 \cdot K(s)$$

$$Req = \frac{1}{S2 \cdot R \cdot C1 \cdot C2} = -\frac{1}{CS2 \cdot R \cdot C1 \cdot C2} = \frac{XC1 \cdot XC2}{R}$$

In conclusion, with lossless capacitors C1 and C2, the circuit of FIG. 4 shows that the equivalent capacitor Ceq is equal to the product of C1 and the open loop gain of the op-amp A1 and Req equal to the products of the impedance of C1 and C2 divided by resistor R. Thus, if the values of Ceq and Req are preselected, then other circuit elements can be sized to get the desired result. For example, if Ceq and the characteristics of the op-amp A1 are known, then C1 will be equal to the Ceq divided by K(s), the gain of the op-amp A1.

For the second set of conditions where capacitor C1 is lossless and capacitor C2 is lossy, that is RS2 has value, then the following equations apply:

$$\frac{1}{SCeq} + Req = \frac{1}{SC1} \cdot \left[\frac{1}{K(s)} + \frac{RS2}{R}\right] +$$

$$\frac{1}{SC1} \cdot \frac{1}{SC2} \cdot \frac{1}{R} = \frac{1}{SC1}\left[\frac{1}{K(s)} + \frac{RS2}{R}\right] + \frac{XC1XC2}{R}$$

$$Ceq = \frac{C1}{\frac{1}{K(s)} + \frac{RS2}{R}}$$

$$Req = \frac{XC1 \cdot XC2}{R}$$

For the third set of conditions where C2 is a lossless capacitor and C1 is a lossy capacitor, which is the most practical application the following equations express the values of Ceq and Req:

$$V1 = IC1 \cdot \left[\frac{1}{SC1} + RS1\right] \cdot \left[\frac{1}{R \cdot SC2} + \frac{1}{K(s)}\right]$$

$$= IC1 \cdot \left[\frac{1}{SCeq} + Req\right]$$

$$Ceq = \frac{C1}{\frac{1}{K(s)} + \frac{C1}{C2} \cdot \frac{RS1}{R}}$$

$$Req = \frac{RS1}{K(s)} + \frac{XC1 \cdot XC2}{R}$$

With a lossy capacitor C1 and a lossless capacitor C2, the result is Ceq and Req expressed by the above equations. Since Req of a typical electrolytic capacitor is typically in the range of a fraction of an ohm to a few ohms, resistor R could be a few megohms which would result in the Ceq being close to the product of the open loop gain of the op-amp A1 and the capacitor C1 with the Req also being decreased in value.

In selecting the values of the circuit parameters, it should be noted that the entire load current passes through C1. Consequently, the voltage drop across C1 may be substantial but it cannot be greater than the maximum voltage swing that the op-amp A1 can deliver. Ideally, C2 should be a lossless high quality capacitor having a value smaller than C1. The size criteria selection for C2 is not as critical. The impedance of C2 may be smaller than R, and this is recommended because a large R is much more economical to obtain.

While R may be large, there are limitations in practice as to its ultimate size. Bias currents of op-amp A1 must be considered and, while R may be made large, it must not be larger than permissible in view of its compatibility with op-amp A1. The op-amp A1 inherently has offset current, and the voltage at the non-inverting input of op-amp A1 would be the product of the bias current plus the offset current and resistor R. Consequently, the voltage at the non-inverting input could become large with a large R, and if it exceeded the supply voltage, the op-amp A1 would not function. Thus, R cannot exceed a range in value which would make it incompatible with the op-amp A1.

The equations expressing values for Ceq and Req for the three conditions described herein allow the determination of the values of R, C1 and C2 within the described limitations for R, C1 and C2. For example, the desired values for Ceq and Req may be substituted in the equations and the values for R, C1 and C2 determined accordingly.

The invention is not limited to the particular details of the circuit depicted and described, and other modifications of the application are contemplated. Certain other changes may be made in the above described circuit without departing from the true spirit and scope of the invention herein described. It is intended, therefore, that the subject matter in the above depiction shall be interpreted as illustrative and not in a limiting sense.

What is claimed is:

1. An improved coupling/decoupling capacitor multiplier having an input terminal connected to a power source and an output terminal connected to a load, comprising:

means for amplifying having an open loop gain of K(S), an inverting input and a non-inverting input and an output said non-inverting input being connected to said input terminal;

a first capacitor C1 being generally lossy and connected to said output of saida amplifier means;

a second capacitor C2 being generally lossless and connected in series with said first capacitor and disposed between said first capacitor and said inverting input of said amplifier means, a junction of said first and second capacitor being connected to said output terminal;

a resistor having an appropriate value connected between said inverting input and said output of said amplifier means, and operatively connected in series with said capacitors; and wherein said multiplier is a two terminal passive device having an equivalent capacitance of $C1/[1/K(S)+C1/C2\times RS1/R]$ whereby the equivalent capacitance of said multiplier is substantially equal to the product of C1 and K(S) when R has said appropriate value.

* * * * *